United States Patent [19]

Hayden

[11] 4,260,985
[45] Apr. 7, 1981

[54] RESISTIVE DEVICE SENSOR

[75] Inventor: Rodney Hayden, Stoney Creek, Canada

[73] Assignee: TRW Inc., Cleveland, Ohio

[21] Appl. No.: 120,430

[22] Filed: Feb. 11, 1980

[30] Foreign Application Priority Data

Feb. 14, 1979 [CA] Canada ................................. 321469

[51] Int. Cl.³ ............................................. G08B 21/00
[52] U.S. Cl. ................................ 340/635; 123/145 A; 340/641
[58] Field of Search ............... 340/641, 642, 643, 635; 123/145 A, 198 D; 315/120, 129, 130, 135, 136

[56] References Cited

U.S. PATENT DOCUMENTS

| 3,626,401 | 12/1971 | Flieder et al. | 340/641 |
| 3,675,033 | 7/1972 | Richard et al. | 123/145 A |
| 3,706,031 | 12/1972 | Boutwell et al. | 340/641 X |
| 3,855,586 | 12/1974 | Jacobs | 340/641 X |
| 3,961,900 | 6/1976 | Gintelia et al. | 340/635 X |
| 3,967,281 | 6/1976 | Dageford | 340/641 X |
| 4,135,145 | 1/1979 | Eberle | 340/642 X |
| 4,214,236 | 7/1980 | Carp et al. | 340/641 X |

Primary Examiner—John W. Caldwell, Sr
Assistant Examiner—Daniel Myer
Attorney, Agent, or Firm—James R. O'Connor; Martin J. O'Donnell; Thomas C. O'Konski

[57] ABSTRACT

A monitoring circuit for electrically conductive resistive devices such as diesel glow plugs in which the devices are fed through an electrically sensitive path, and the voltage across the electrical devices is sensed with respect to a reference. If the sensed voltage is above the reference indicating the presence of a defective device, a warning is indicated. The circuit includes means allowing warm up of the devices before sensing, and for inhibiting signals, which would otherwise indicate a false warning, after a chosen period for sensing.

5 Claims, 4 Drawing Figures

RESISTIVE DEVICE SENSOR

BACKGROUND OF THE INVENTION

This invention relates to a monitoring device for electrically conductive resistive devices such as glow plugs used for starting diesel engines and has particular reference to the detection of failure of one of a number of glow plugs in such an engine.

Diesel engines though more expensive to manufacture than the normal Otto-cycle gasoline engine are increasing in both popularity and importance at the present, particularly for automotive devices. They can produce very good efficiency in terms of work done, or distance moved by a vehicle, for a given quantity of fuel consumed, compared with the gasoline engine.

In the past, the starting of such engines has been its major drawback. The compression ratio of diesel engines is very high, the temperature for ignition of the fuel injected into the cylinders being obtained solely by the compression of the air in the cylinders. Compression ratios are thus of the order of 24 to 1 and, therefore, large batteries are required for engine cranking. Alternatively, a supply of compressed air must be maintained, or generated independently such as by an auxiliary engine, for starting the engine. In the past, the starting of such engines, particularly in large trucks, has been so difficult that it has often been necessary to leave engines running for long periods, sometimes overnight, to avoid delays in getting underway subsequently.

This starting problem has largely been met in recent years by the use of glow plugs, which comprise essentially electrical wires suitably placed in the cylinders and made incandescent by battery current. A diesel engine so equipped can be started relatively easily upon cranking, injecting of fuel and supply of current to the plugs. After starting, the current supply is switched off.

One problem which arises in using such glow plugs is that, occasionally one may become defective or fail, so that ignition in the cylinder concerned is haphazard, and proper firing occurs only after the engine has been brought up to speed and warmed somewhat by the remaining operating cylinders. Since a typical engine will have 8 cylinders, one has the possibility of any one of 8 plugs failing at any time and the operator may not readily realize that a plug has failed, merely that the engine is a bit hard to start. With the general public now having diesel automobiles, it is even more important that a positive indication of a failed plug be given which otherwise might lead to a period of months before such defect would be found in periodic inspection such as when the vehicle is undergoing major servicing. Long periods when one of the cylinders is not starting properly is detrimental and can lead to engine damage, by washing of the cylinder walls by unburnt fuel and consequent wear. A reliable quick means of identifying a defective plug condition will thus save a great deal of time and expense in repair servicing, and also allow consistently better performance.

The present disclosure meets the problems outlined above and provides a system for the detection of defective glow plugs in a reliable and accurate manner using a circuit which can be set up quite simply on the engine or automotive vehicle concerned.

SUMMARY OF THE INVENTION

More particularly in accordance with the invention, there is provided a sensing circuit for determining the operating state of at least one electrically conducting resistive device requiring an initial non sensed period after initiation of current through said device which comprises:

a resistive feed to said device, means for applying a source of electric current to said resistive feed, means sensing voltage applied across said device by said resistive feed, means comparing said voltage sensed with a reference and developing an output upon the compared value, means developing a time varying voltage initiated at a time corresponding to a time of operation of said source applying means, said time varying voltage passing through a known range over a predetermined time period following said intitial period, means feeding said compared value output to a further comparison device for comparison of said compared value output with said time varying voltage and developing an output dependent upon the magnitude of said compared value output with respect to said time varying voltage, means inhibiting output from said further comparison device before said time varying voltage reaches said known range, and means indicating output from said further comparison device when said output corresponds to said sensed voltage being of a chosen value with respect to said reference.

Means may also be included for inhibiting output from the further comparison device when the time varying voltage passes beyond the known range. There may be means for adjusting the reference, and the indicating means may comprise a lamp with associated switching means actuated by output from the further comparison device.

DESCRIPTION OF A PREFERRED EMBODIMENT

Figure 1:
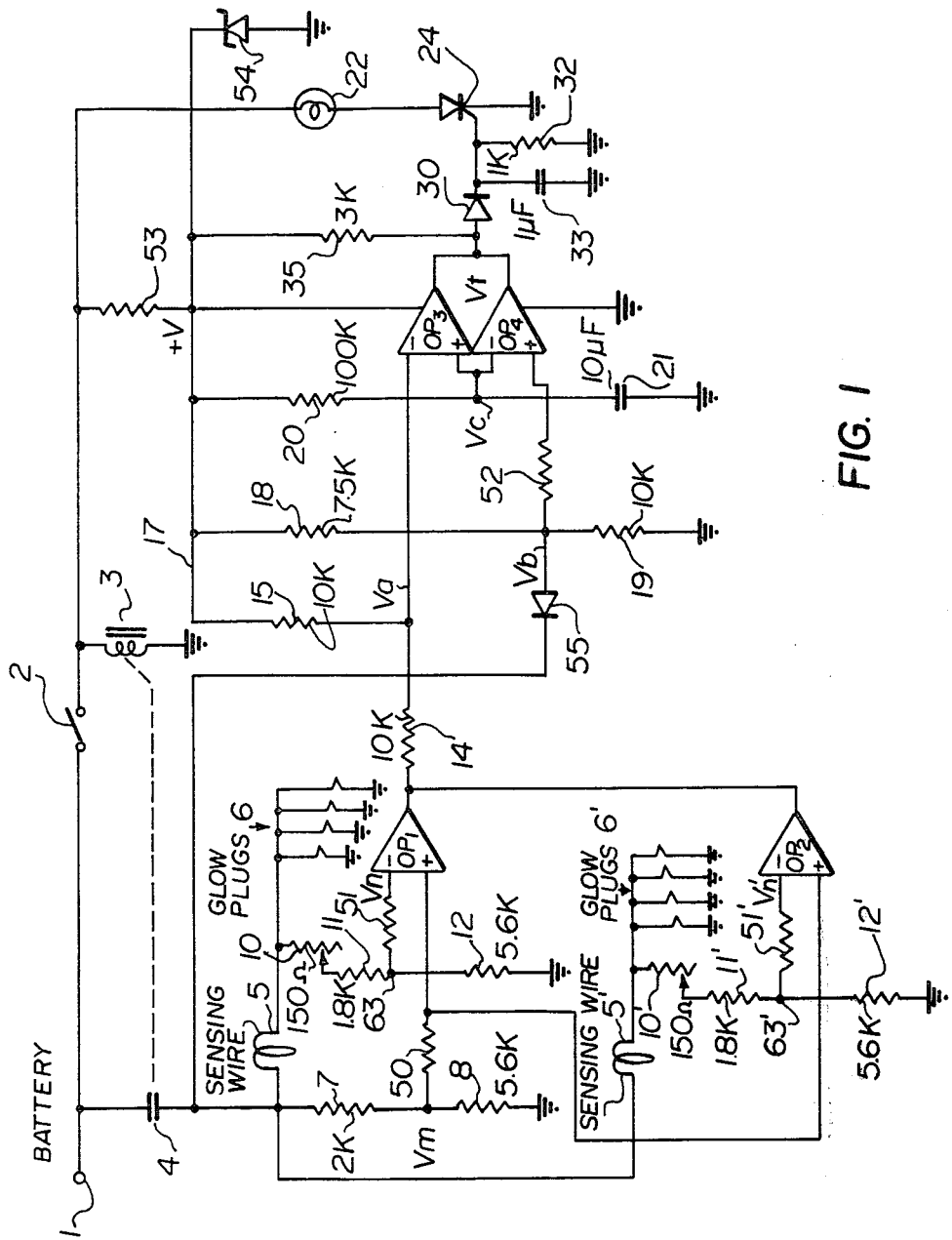
FIG. 1 shows a schematic diagram of a glow plug sensor system embodying the invention.
Figure 3:
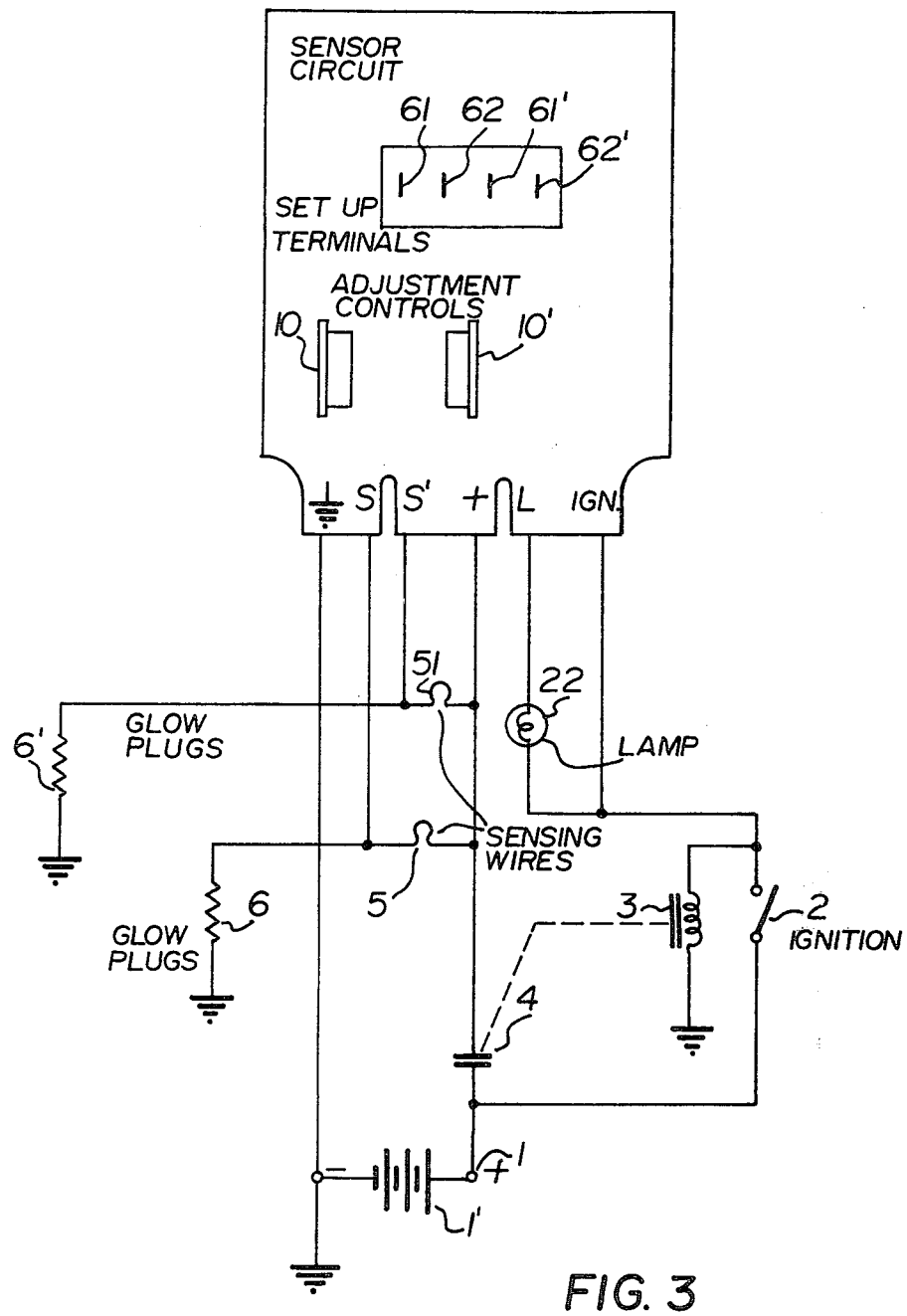
FIG. 3 is a partly diagrammatic practical layout for the circuit of FIG. 1.

Having reference to FIGS. 1 and 3, a terminal 1 is supplied with battery-positive potential from a suitable automotive type battery 1'. Ground return shown at several points in FIG. 1 and battery negative are connected together and to the engine or chassis (not shown). An ignition switch 2 is connected so that, on operation, it will pass current through a suitable relay energizing coil 3' to close relay contacts 4. In certain instances, if it is not suitable to use a relay, the contacts 4 could be replaced by a transistor or other current switching device sensitive to the "on" condition of the switch 2. Time out means, not shown, can be provided to open switch 2 or relay 3 or contacts 4 after the engine has started, or after a further time delay.

The closing of relay contacts 4 supplies battery-positive through a respective sensing wire 5 and 5' to glow plug sets 6 and 6'. The relay contacts also feed a voltage divider circuit consisting of resistors 7 and 8 to the junction of which through current limiting resistor 50, connections are made respectively to the positive inputs of operational amplifiers $OP_1$ and $OP_2$ respectively. To the battery-positive side of each set of glow plugs is connected a respective voltage divider circuit consisting of variable resistance 10, fixed resistance 11 and fixed resistance 12 and resistors 10', 11' and 12' respectively. The junction of resistors 11 and 12 is connected, through limiting resistor 51, to the negative input of $OP_1$ and the junction of resistors 11' and 12', through resistor 51', to the negative input of amplifier $OP_2$.

The outputs of $OP_1$ and $OP_2$ are connected together in parallel and through series connected resistors 14 and 15 to positive rail 17 fed through resistor 53 and ignition switch 2 from battery-positive terminal 1. A zener diode 54 stabilizes the voltage on rail 17 with respect to ground at a value $+V$ and limits any transients which might occur. Connected between rail 17 and ground is a voltage divider consisting of resistors 18 and 19, a series connected resistor 20 and capacitor 21. A lamp 22 with series connected thyristor 24 is connected between ignition switch 2 and ground. A diode 55 joins the junction of resistors 18 and 19 to contacts 4, its anode being connected to the junction. The junction of resistors 18 and 19 is also connected through a limiting resistor 52 to the positive input of an operational amplifier $OP_4$. The junction of resistor 20 and capacitor 21 connects to the negative input of $OP_4$ and the positive input of an operational amplifier $OP_3$. The junction of resistors 14 and 15 connects to the negative input of amplifier $OP_3$. The outputs of amplifier $OP_3$ and $OP_4$ are parallelled and connect through a diode 30 to the gate 31 of the thyristor 24. The gate 31 is returned to ground through resistor 32 and is parallelled by capacitor 33. A load for amplifiers $OP_3$ and $OP_4$ is provided by a resistor 35 between the outputs of the amplifiers and rail 17.

In normal conditions, the operation of this circuit is as follows:

When the ignition switch 2 is closed, battery-positive is supplied to rail 17 and also by closing of relay contacts 4 to the glow plugs 6 and 6'. A voltage Vm will be applied to the positive inputs of $OP_1$ and $OP_2$ and be of a value determined by the ratio of resistor 7 to resistor 8. A voltage Vn will be supplied to the negative input of $OP_1$ and a voltage Vn' to the negative input of $OP_2$. Vn and Vn' will both be lower than Vm so that the outputs of each of $OP_1$ and $OP_2$ are high. This leads to a high voltage Va at the junction of resistors 14 and 15 which will be close to the voltage $+V$ on rail 17. When ignition switch 2 has initially been switched on, capacitor 21 will have started to charge through resistor 20 from ground towards the positive voltage $+V$ (see also FIG. 2a). In the initial stages, during the period when the glow plugs are warming up, the voltage Vc, at the junction of resistor 20 and capacitor 21 will be low. At this time, however, the voltage Vb at the junction of resistors 18 and 19 will be higher than Vc which results in a high output for $OP_4$. During this period, Va will be greater than Vc so that the output of $OP_3$ is low, thereby resulting in low output Vt to the diode 30. The design of the operational amplifiers $OP_1$ to $OP_4$ is such that low output is at low impedance so that any amplifier in the low output condition will override an amplifier in the high output condition. As Vc continues to rise, it will reach a point at which it exceeds Vb so that $OP_4$ will then switch low. Vc then continues its rise exponentially to voltage $+V$ and, at some point, will switch $OP_3$ high since Vc will then exceed Va, however, the overriding effect of $OP_4$ will ensure that the combined output Vt remains low and that no signal is fed through diode 30.

Should, however, one of the glow plugs fail (let us assume for the sake of argument one of those in group 6 becomes open-circuited), the voltage Vn will rise above the normal, resulting in a low output from $OP_1$. Now, although in the initial stage of the timing action by resistor 20 and capacitor 21, during a period for glow plug warm-up, $OP_4$ will remain low as before, a sensitive stage will be reached where Vc is still below Vb (giving a high output for $OP_4$) but, where Vc exceeds Va. This latter results in a high output for $OP_3$ and, thus a high Vt so that current will flow through diode 30 to charge capacitor 33. When the trigger voltage for the gate 31 of thyristor 24 is reached, the lamp 22 will light signalling to the operator the presence of a defective glow plug. This light will remain "on" for the period that the switch 2 is "on", giving warning of the defect. It should be understood that if continuous warning of the defective plug is desirable the light 22 may be returned to the battery-positive supply either directly or through another switch such as the engine master ignition switch rather than through the switch 2. The light will then remain "on" even though switch 2 may be opened.

As Vc continues to rise, it will exceed Vb, result in a low output from $OP_4$ and, thence, inhibit any further feed through diode 30.

Figure 2:
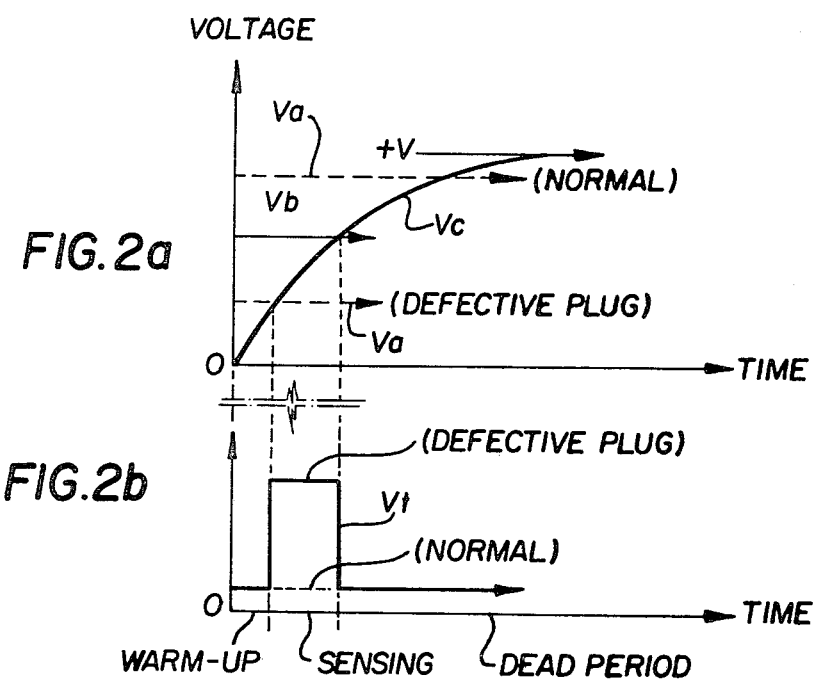
FIGS. 2a and 2b are graphs of voltage against time for various parts of the circuit of FIG. 1.

These conditions are illustrated in FIG. 2b where $V+$ shows the output voltage of $OP_3$ and $OP_4$ in the presence of a defective plug in time relation to the voltages Va, Vb and Vc. There is a sensing period for the presence of a defective plug while the voltage Vc rises between the value of Va in the presence of a defective plug and the set value Vb. The sensing period is preceded by a warm-up period and followed by a dead period, in both of which there is no sensing.

The advantages of this arrangement are that no sensing takes place while the glow plugs are warming up and attaining a steady state resistance. Again, after the engine has started when additional heat is present in the cylinders due to the combustion of the fuel and the plugs are hotter and of higher resistance, no false indication of a defective plug is given as a result of this higher resistance, during the period when the engine continues to be cranked or before time out of contacts 4. The capacitor 33 in conjunction with the diode 30 acts as an integrator and noise gate to prevent false triggering of thyristor 24 from any stray pulses which may enter the circuit, such as from the generator or engine starter circuit. The diode 55 is required for instances in which the engine may be started when warm and when the circuitry (not shown) sensitive to engine temperature may be arranged to open contacts 4 ahead of normal time out, such as by interrupting current flow through coil 3. If such opening occurs, it is possible for $OP_1$ or $OP_2$ to produce an output apparently indicative of a faulty plug, and if this occurs during the sensing period, a false indication would be given by lamp 22. However, the diode 55 whose cathode will be more negative than its anode, at such time allows the voltage Vb to be reduced below Vc and thus cut off the sensing faculty of $OP_3$ by producing a low output on $OP_4$.

Resistors 7 and 8 form a voltage divider to establish the input reference voltage Vm whereas variable resistors 10 and 10' are chosen so that Vn or Vn 40 is higher than Vm under normal conditions but that Vn or Vn' is below Vm when a glow plug in the respective group 6 or 6' is defective. The maximum value of variable resistor 10 or 10' is chosen with respect to its respective resistors 11 and 12 or 11' and 12' so that, under all anticipated conditions of battery supply voltage, tolerances and temperature variations, there will be sufficient adjustment so that the normal differential voltge Vn−Vm (or Vn'−Vm) will equal the differential voltage Vm−Vn (or Vm−Vn') with one plug failure.

Resistors 7 and 8, 10 plus 11 and 12; and 10' plus 11' and 12' are chosen so that Vm and Vn (or Vn') are a maximum possible but also so that the differences between the supply voltage (which is fed separately by means not shown, such as from rail 17, to energize the operational amplifiers OP₁ to OP₄) and the input common mode voltages to the amplifier are equal to or greater than 2 volts. In the prototype, each sensing wire, when supplying four glow plugs, suitably comprised 4 feet of number 10 gauge copper wire with $OP_1$ to $OP_4$ being a guad comparator SC9551 (MC3302), ($OP_1$ and $OP_2$ being one-half and $OP_3$ and $OP_4$ comprising the other half).

The thyristor 24 suitably comprises a C103YX90 selected for a minimum required gate current of 30 μA. The values of the components given in FIG. 1 are typical prototype figures for a nominal battery voltage of 12 volts.

The warm-up period can be calculated from the following formula:

$$\text{Warm-up period} = -R20 \cdot C21 \ln\left(1 - \frac{R14}{R15 + R14}\right)$$

seconds and the sensing period from the following formula:

$$\text{Sensing period} = R20 \cdot C21 \ln\left[\frac{1 - \frac{R14}{R15 + R14}}{1 - \frac{R19}{R18 + R19}}\right] \text{ seconds.}$$

Reference to FIG. 3 shows a typical component layout partly in schematic form illustrating the adjustable resistors 10 and 10' for set up on the vehicle concerned. Also illustrated are four terminals 61, 62, 61' and 62', wherein the junction 63 of resistors 11 and 12 and junction 63' of resistors 11' and 12' are connected respectively to terminals 61 and 61'. The terminals 62 and 62' are connected to the grounded ends of resistors 12 and 12' respectively. The circuit is then adjusted in situ so that, with the switch 2 turned on and sets of goods plugs 6 and 6' connected in place, resistors 10 and 10' are adjusted respectively until corresponding chosen predetermined voltages are measured between terminals 61 and 62 and 61' and 62' respectively.

I claim:

1. A sensing circuit for determining the operating state of at least one electrically conducting resistive device requiring an initial non sensed period after initiation of current through said device which comprises:
   a resistive feed to said device,
   means for applying a source of electric current to said resistive feed,
   means sensing voltage applied across said device by said resistive feed,
   means comparing said voltage sensed with a reference and developing an output dependent upon the compared value,
   means developing a time varying voltage initiated at a time corresponding to a time of operation of said source applying means, said time varying voltage passing through a known range over a predetermined time period following said initial period,
   means feeding said compared value output to a further comparison device for comparison of said compared value output with said time varying voltage and developing an output dependent upon the magnitude of said compared value output with respect to said time varying voltage,
   means inhibiting output from said further comparison device before said time varying voltage reaches said known range, and
   means indicating output from said further comparison device when said output corresponds to said sensed voltage being of a chosen value with respect to said reference.

2. A circuit as defined in claim 1 comprising further means inhibiting output from said further comparison device when said time varying voltage passes beyond said known range.

3. A circuit as defined in claim 1 in which said voltage sensing means includes an adjustable voltage divider.

4. A circuit as defined in claim 1 in which said indicating means comprises a lamp, and switching means for said lamp actuated by the output from said further comparison device.

5. A circuit as defined in claim 1 in which said means indicating output is effected when said output corresponding to said sensed voltage is higher than a predetermined value.

* * * * *